United States Patent
Roberts et al.

(10) Patent No.: US 11,258,517 B2
(45) Date of Patent: *Feb. 22, 2022

(54) BURST MODE SPECTRAL EXCURSION MITIGATION

(71) Applicant: Calix, Inc., San Jose, CA (US)

(72) Inventors: Harold A. Roberts, Excelsior, MN (US); Nicholas A. Proite, St. Paul, MN (US); Christopher T. Bernard, Wayzata, MN (US); Peter O. Lee, Rogers, MN (US)

(73) Assignee: Calix, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/107,266

(22) Filed: Nov. 30, 2020

(65) Prior Publication Data

US 2021/0083777 A1    Mar. 18, 2021

Related U.S. Application Data

(63) Continuation of application No. 16/730,709, filed on Dec. 30, 2019, now Pat. No. 10,887,021.

(60) Provisional application No. 62/788,213, filed on Jan. 4, 2019.

(51) Int. Cl.
| | |
|---|---|
| *H04B 10/564* | (2013.01) |
| *H04B 10/50* | (2013.01) |
| *H01S 5/068* | (2006.01) |
| *H04J 14/08* | (2006.01) |

(52) U.S. Cl.
CPC .......... *H04B 10/564* (2013.01); *H01S 5/068* (2013.01); *H04B 10/505* (2013.01); *H04J 14/08* (2013.01)

(58) Field of Classification Search
CPC ..... H04B 10/564; H04B 10/505; H01S 5/068; H04J 14/08
See application file for complete search history.

(56) References Cited

U.S. PATENT DOCUMENTS

| | | |
|---|---|---|
| 2015/0063812 A1 | 3/2015 | Dove et al. |
| 2016/0119061 A1 | 4/2016 | Jiang et al. |
| 2019/0157832 A1 | 5/2019 | Wu et al. |
| 2019/0288479 A1 | 9/2019 | Kawahara et al. |
| 2020/0220623 A1 | 7/2020 | Roberts et al. |

OTHER PUBLICATIONS

Fujiwara et al., "Suppression of Thermal Wavelength Drift in Super-Structure Grating Distributed Bragg Reflector (SSG-DBR) Laser with Thermal Drift Compensator," IEEE Journal of Selected Topics in Quantum Electronics, vol. 13, No. 5, Sep./Oct. 2007, pp. 1164-1169.

Nauheim, "Short Term Spectral Excursion," Calix, Sep. 2013, 18 pp.

Antony et al., "High Extinction Switching of SOAs for In-Band Crosstalk Reduction in PON," Electronics Letters, vol. 44, No. 14, Jul. 3, 2008, pp. 872-874.

(Continued)

*Primary Examiner* — Casey L Kretzer
(74) *Attorney, Agent, or Firm* — Shumaker & Sieffert, P.A.

(57) ABSTRACT

Techniques are described for configuring an optical network unit (ONU) in a pre-burst state prior to transitioning the ONU to a burst-on state. During the pre-burst state, a laser emitter of the ONU stabilizes to its wavelength, thereby reducing the impact of wavelength drift when the ONU transitions to the burst-on state.

20 Claims, 7 Drawing Sheets

(56) References Cited

OTHER PUBLICATIONS

ITU-T G.989.1, Series G: Transmission Systems and Media, Digital Systems and Networks, Digital sections and digital line system—Optical line systems for local and access networks, 40-Gigabit-capable passive optical networks (NG-PON2): General requirements, Mar. 2013, 26 pp.

ITU-T G.989.2, Series G: Transmission Systems and Media, Digital Systems and Networks, Digital sections and digital line system—Optical line systems for local and access networks, 40-Gigabit-capable passive optical networks 2 (NG-PON2): Physical media dependent (PMD) layer specification; Dec. 2014, 108 pp.

ITU-T G.989.3, Series G: Transmission Systems and Media, Digital Systems and Networks, Digital sections and digital line system—Optical line systems for local and access networks, 40-Gigabit-capable passive optical networks (NG-PON2): Transmission convergence layer specification, Oct. 2015, 250 pp.

IEEE Std. 802.3ah-2004, "Part 3: Carrier Sense Multiple Access with Collision Detection (CSMAICD) Access Method and Physical Layer Specifications Amendment: Media Access Control Parameters, Physical Layers and Management Parameters for Subscriber Access Networks," Sep. 7, 2004, 640 pp.

ITU-T G.983.1, Series G: Transmission Systems and Media, Digital Systems and Networks, Digital sections and digital line system—Optical line systems for local and access networks, Broadband optical access systems based on Passive Optical Networks (PON), Jan. 2005, 124 pp.

ITU-T G.983.2, Series G: Transmission Systems and Media Digital Systems and Networks, Digital sections and digital line system—Optical line systems for local and access networks, ONT management and control interface specification for B-PON, The International Telecommunication Union. Jul. 2005, 370 pp.

ITU-T G.984.1, Series G: Transmission Systems and Media, Digital Systems and Networks, Digital sections and digital line system—Optical line systems for local and access networks, Gigabit-capable passive optical networks (GPON): General characteristics, Mar. 2008, 43 pp.

ITU-T G.984.2, Series G: Transmission Systems and Media Digital Systems and Networks, Digital sections and digital line system—Optical line systems for local and access networks, Gigabit-capable passive optical networks (GPON): Physical Media Dependent (PMD) layer specification, The International Telecommunication Union. Mar. 2003, 38 pp.

ITU-T G.984.3, Series G: Transmission Systems and Media Digital Systems and Networks, Digital sections and digital line system—Optical line systems for local and access networks, Gigabit-capable passive optical networks (GPON): Transmission convergence layer specification, The International Telecommunication Union. Mar. 2008, 146 pp.

ITU-T G.984.4, Series G: Transmission Systems and Media Digital Systems and Networks, Digital sections and digital line system—Optical line systems for local and access networks, Gigabit-capable passive optical networks (GPON): ONT Management and Control Interface Specification, The International Telecommunication Union. Feb. 2008, 430 pp.

ITU-T G.987.3, "10-Gigabit-capable passive optical networks (XG-PON): Transmission convergence (TC) layer specification," Series G: Transmission Systems and Media, Digital Systems and Networks Digital sections and digital line system—Optical line systems for local and access networks, Jan. 2014, 146 pp.

Poehlmann et al., "Wavelength Drift of Burst-Mode DML for TWDM-PON [Invited]," Journal of Optical Communications and Networking, Vo. 7, No. 1, Jan. 2015, pp. A44-A51.

Roberts, "Fiber Connect 2017, NG-PON2 Optical Components Update," Calix, Fiber Broadband Association, Jun. 12-14, 2017, 27 pp.

Prosecution History from U.S. Appl. No. 16/730,709, dated Feb. 19, 2020 through Sep. 1, 2020, 16 pp.

BURST MODE SPECTRAL EXCURSION MITIGATION

This application is a continuation application of U.S. patent application Ser. No. 16/730,709, filed Dec. 30, 2019, which claims the benefit of U.S. Provisional Patent Application No. 62/788,213, filed Jan. 4, 2019, the contents of all of which are incorporated by reference herein.

TECHNICAL FIELD

This disclosure relates to networking, and more particularly, communication between an optical network unit and an optical line terminal (OLT) in an optical network.

BACKGROUND

Optical network units (ONUs) permit a subscriber to access a variety of information via a network. A passive optical network (PON), for example, can deliver voice, video and data among multiple network nodes, using a common optical fiber link. Passive optical splitters and combiners enable multiple ONUs to share the optical fiber link. Each ONU terminates the optical fiber link for a residential or business subscriber, and is sometimes referred to as a subscriber premises node that delivers Fiber to the Premises (FTTP) services.

In some systems, an ONU is connected with wiring to one or more subscriber devices in the subscriber premises, such as televisions, set-top boxes, telephones, computers, or network appliances, which ultimately receive the voice, video and data delivered via the PON. In this manner, the ONU can support delivery of telephone, television and Internet services to subscriber devices in the subscriber premises.

SUMMARY

In general, this disclosure describes example techniques for mitigating the effects of spectral excursion (also called wavelength drift). Spectral excursion refers to the change in the wavelength of a laser emitter as the current injection heats the laser emitter and changes the laser emitter temperature. In some cases, the spectral excursion can cause crosstalk between laser emitters that normally output at different wavelengths, but whose wavelengths are changing due to changes in temperature from the current injection.

This disclosure describes example techniques for configuring an optical network unit (ONU) in a pre-burst state. The pre-burst state occurs after a burst-off state. In the burst-off state, a laser emitter of the ONU is configured to output little to no optical power (e.g., below an optical power threshold). In the pre-burst state, the laser emitter of the ONU is configured to output optical power at or above the optical power threshold. However, in the pre-burst state, an optical attenuator coupled to the laser emitter of the ONU is configured to attenuate the optical power generated by the laser emitter. Then, the ONU transitions to the burst-on state. In the burst-on state, the laser emitter of the ONU is outputting a modulated optical signal and the optical attenuator is in the non-attenuation state allowing the optical signal (and possibly amplifying the optical signal) to pass through. In some examples, the pre-burst state may be long enough to allow the laser emitter wavelength to stabilize. Also, because a plurality (e.g., most, all, or all but one) of the other ONUs are in the burst-off state and their respective laser emitters are not outputting optical power, there may be little to no optical power to interfere (e.g., cause crosstalk) with the optical signal of the ONU that is outputting the optical signal.

In one example, the disclosure describes an optical network unit (ONU) comprising a laser emitter, a laser driver coupled to the laser emitter, an optical attenuator having an attenuation state and a non-attenuation state, and a controller configured to configure the ONU in a pre-burst state, wherein, in the pre-burst state, the controller configures the laser driver to flow current through the laser emitter, and the controller configures the optical attenuator to be in the attenuation state after the ONU has been in a burst-off state, wherein, in the burst-off state, the current through the laser emitter is reduced such that an amount of optical power outputted by the laser emitter is less than an optical power threshold, and subsequent to the pre-burst state, configure the ONU in a burst-on state, wherein in the burst-on state, the controller configures the laser driver to flow current through the laser emitter, and the controller configures the optical attenuator to be in the non-attenuation state, wherein in the burst-on state, the current through the laser emitter is increased such that the amount of optical power outputted by the laser emitter is greater than or equal to the optical power threshold.

In one example, the disclosure describes a method comprising configuring, with a controller, an optical network unit (ONU) in a pre-burst state, wherein configuring the ONU in the pre-burst state comprises configuring a laser driver of the ONU to flow current though a laser emitter of the ONU and configuring an optical attenuator to be in an attenuation state after the ONU has been in a burst-off state, wherein, in the burst-off state, the current through the laser emitter is reduced such that an amount of optical power outputted by the laser emitter is less than an optical power threshold, and subsequent to the pre-burst state, configuring, with the controller, the ONU in a burst-on state, wherein configuring the ONU in the burst-on state comprises configuring the laser driver to flow current through the laser emitter and configuring the optical attenuator to be in a non-attenuation state, wherein in the burst-on state, the current through the laser emitter is increased such that the amount of optical power outputted by the laser emitter is greater than or equal to the optical power threshold.

In one example, the disclosure describes a computer-readable storage medium storing instructions thereon that when executed cause a controller of an optical network unit (ONU) to configure the ONU in a pre-burst state, wherein the instructions that cause the controller to configure the ONU in the pre-burst state comprise instructions that cause the controller to configure a laser driver of the ONU to flow current though a laser emitter of the ONU and configure an optical attenuator to be in an attenuation state after the ONU has been in a burst-off state, wherein, in the burst-off state, the current through the laser emitter is reduced such that an amount of optical power outputted by the laser emitter is less than an optical power threshold, and subsequent to the pre-burst state, configure the ONU in a burst-on state, wherein the instructions that cause the controller to configure the ONU in the burst-on state comprise instructions that cause the controller to configure the laser driver to flow current through the laser emitter and configure the optical attenuator to be in a non-attenuation state, wherein in the burst-on state, the current through the laser emitter is increased such that the amount of optical power outputted by the laser emitter is greater than or equal to the optical power threshold.

The details of one or more aspects of the disclosure are set forth in the accompanying drawings and the description below. Other features, objects, and advantages of the disclosure will be apparent from the description and drawings, and from the claims.

DETAILED DESCRIPTION

Figure 1:
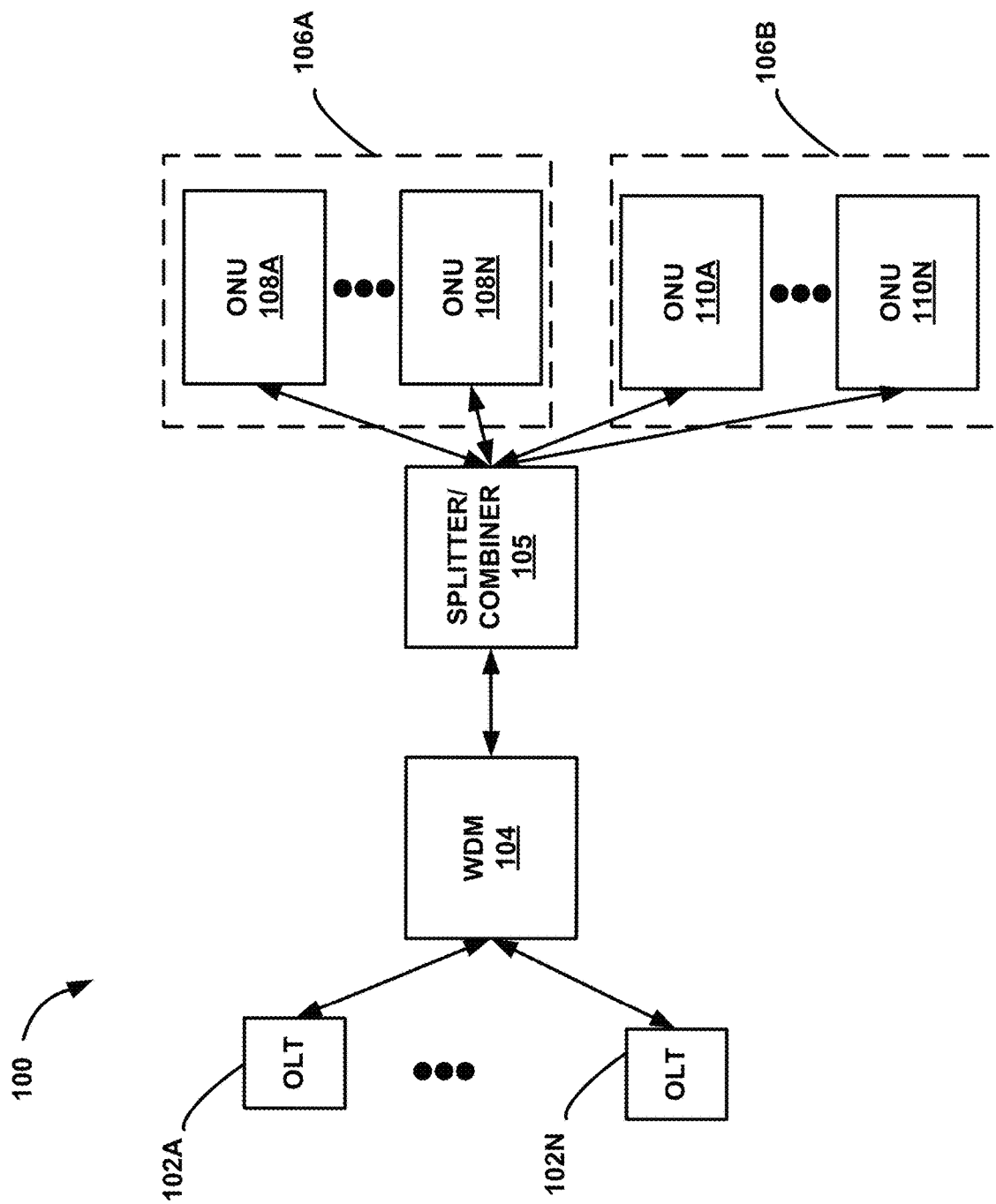
FIG. 1 is a block diagram illustrating a network, in accordance with one or more aspects of this disclosure.

An optical network includes an optical line terminal (OLT), a wave division multiplexer (WDM), one or more splitters, and a plurality of ONUs such as optical network units (ONUs), also referred to as optical network terminals (ONTs). The OLT connects to the optical WDM, a feeder fiber extends from the WDM to one or more splitters/combiners (e.g., passive optical splitters/combiners), and each of the one or more splitters/combiners output to respective ONUs via a drop fiber (also called distribution fiber) in the downstream. In the upstream, each one of the ONUs output to the respective splitter/combiners with the respective drop fibers, the one or more splitter/combiners combine the optical signals from the ONUs, and output to the WDM and back to the OLT.

For downstream transmission, the OLT outputs an optical signal to the WDM, and the WDM transmits the optical signal to each ONU via respective fiber links (e.g., via the one or more splitters/combiners). Each of the ONUs determine whether the received optical signal is addressed to it or to another ONU. The ONUs process the optical signal when the optical signal is addressed to it.

For upstream transmission, each ONU transmits a respective optical signal to the WDM via respective splitters/combiners, and the WDM separates the optical signals for separate transmission to respective OLTs (e.g., in the upstream direction, the WDM separates the multi-wavelength transmission to go to separate single wavelength OLT receiver ports). Each ONU may reside at a subscriber premises, or a plurality of subscriber premises may share a common ONU. Each ONU receives data from devices at one or more subscriber premises, converts the received data into the optical signal, and outputs the optical signal to the OLT via respective fiber links and the optical splitter/combiner. In some examples, one or more of the ONUs may be connected to a wireless transmission/reception device such as a radio for high frequency communication (e.g., via 5G wireless networks) rather than a subscriber premises. In such examples, the ONUs receive data from respective radios for upstream transmission and output data to the respective radios for downstream transmission.

In general, this disclosure describes example techniques for mitigating the effects of spectral excursion (also called wavelength drift). Burst mode spectral excursion (BMSE) or 'short term spectral excursion' (STSE) or simply 'wavelength drift' is the phenomena that occurs in burst mode laser emitters when the wavelength of the laser shifts as the current injection heats the laser emitter which shifts the wavelength as temperature changes. This excursion can be large enough to move the laser into another wavelength channel and cause interference as well as disrupt communication on the desired channel. Accordingly, spectral excursion refers to the change in the wavelength of a laser as the current injection heats the laser emitter and changes the laser emitter temperature. In some cases, the spectral excursion can cause crosstalk between laser emitters that normally output at different wavelengths, but whose wavelengths are changing due to changes in temperature from the current injection.

For example, in burst-mode systems, there are a plurality of optical network units (ONUs) that are configured for a burst-on state and a burst-off state. In the burst-on state, an ONU outputs an optical signal at a particular wavelength and at a particular time for a short-period, referred to as burst-on time period. In the burst-off state, the ONU does not output during a burst-off time period. Then, another ONU, that was in a burst-off state, enters the burst-on state and outputs an optical signal during its burst-on time period, and so forth for each ONU. In some examples, the spectral excursion when a laser emitter of an ONU is turning on (e.g., when transitioning to a burst-on state from the burst-off state), for outputting the optical signal for the burst-on time period, can cause the wavelength of the optical signal to drift to a non-optimal wavelength range of a wavelength multiplexer (WM) that is configured to multiplex the signals from the different ONUs. In some cases, the spectral excursion may cause such different large amount of drift that the wavelength becomes that of another ONU. In such cases, it may be possible that the optical line terminal (OLT) that receives the optical signal determines that the optical signal originated from the other ONU.

One example way in which to address this drift issue is to keep the laser emitters of the ONUs running even during the burst-off state so that the laser emitters of the ONUs are not starting from zero current state when transitioning from the burst-off state to the burst-on state. In other words, if there is current always flowing through the laser emitter, the spectral excursion that occurs when current is first injected at the start of burst-on state may not occur because the current through the laser emitter is not turned off. However, during the burst-off time period of an ONU, the OLT should not receive any optical signal from the ONU, but the laser emitter of the ONU is still outputting optical power because current is still flowing through the laser emitter. Accordingly, an optical attenuator having an attenuation state and a non-attenuation state is coupled to the output of the laser emitters of the ONUs. In such examples, when an ONU is to be in the burst-off state, the optical attenuator for that ONU may be configured in an attenuation state to attenuate the optical power from reaching the OLT. When the ONU is to be in the burst-on state, the optical attenuator for that ONU may be configured in a non-attenuation state to allow the optical signal to pass through.

However, in such techniques that utilize an optical attenuator, there may be technical problems. For example, a plurality of the ONUs may be in the burst-off state, and the attenuation from the optical attenuators of each of the ONUs may not be sufficient. Therefore, the output of the ONUs that are in burst-off state may leak into the output of the ONU that is to be in the burst-on state. In some cases, the leakage from the outputs of the ONUs that are in the burst-off state may be additive. The ONU in the burst-off state is still outputting optical power because the laser emitter is kept on to mitigate spectral excursion, but the optical attenuator may not provide sufficient attenuation. In such cases, there may be leakage into the ONU that is actually supposed to be transmitting (e.g., the ONU in burst-on state).

Furthermore, keeping lasers of ONUs continuously running may also be power inefficient. For instance, even though an ONU does not need to output during the burst-off state, the laser of the ONU is nevertheless kept operational, which results in the ONU consuming unnecessary power. Also, the ONUs may be packaged in particular form factor (e.g., small form factor (SFP)) modules. The form factor modules may be rated for power levels. Consuming power by draining current through the laser even when the ONU does not need to output (e.g., in the burst-off state) results in a reduction in power budget that is available for the rest of the components of the ONU, or in the case of 5G, power needed by the 5G radio to remain close to, even if a little higher than, the rated power level. Moreover, by draining current through the laser even when the ONU does not need to output results in additional thermal heating of the modules. If less power is consumed, then there may be less heat to dissipate, thereby reducing thermal heating.

In the techniques described in this disclosure, in a burst-off state, the laser emitters of the ONUs in the burst-off state are turned off (e.g., no to little current is flowing through the laser emitters). To mitigate the issues with spectral excursion, the disclosure describes a pre-burst state. In the pre-burst state, the laser emitter of an ONU is turned on, but the optical attenuator is kept in attenuation state. This allows the laser emitter to heat up and change wavelengths but limit the optical power that is outputted because the optical attenuator is in the attenuation state. Then, when it is time for the ONU to burst-on, the optical attenuator is configured in the non-attenuation state.

In this manner, because the laser emitters of the ONUs are configured to not output optical power or possibly output little optical power (e.g., less than an optical power threshold) during the burst off state, there may be very little to no crosstalk with the laser emitter of a first ONU that is currently in burst on state. Then, before a second ONU is to enter the burst-on state, the second ONU may enter the pre-burst state where the laser emitter of the ONU starts to output optical power, but the optical attenuator limits the output of the optical power. The length of time of the pre-burst state may be long enough to allow the wavelength of the laser emitter of the second ONU to stabilize. Then, the second ONU enters the burst-on state and the optical attenuator is configured for the non-attenuation state to allow the optical signal to output to the OLT.

It may be possible that when the second ONU is in the pre-burst state and the first ONU is in the burst-on state that, due to imperfections of the optical attenuator of the second ONU, some of the optical power that the second ONU outputs during the pre-burst state interferes (e.g., crosstalks) with the optical signal that the first ONU is still outputting. However, because all other ONUs are in the burst-off state with little to no optical power being outputted, the only interference with the optical signal from the first ONU may be that of the second ONU, which may be minimal and insufficient to corrupt the optical signal from the first ONU.

Accordingly, this disclosure describes example of an optical network unit (ONU) that includes a laser emitter, a laser driver coupled to the laser emitter, where the laser driver controls current to flow or not flow through the laser emitter, an optical attenuator having an attenuation state and a non-attenuation state, and a controller. The controller is configured to configure the laser driver and the optical attenuator in a pre-burst state. In the pre-burst state, the controller configures the laser driver to flow current through the laser emitter, and the controller configures the optical attenuator to be in the attenuation state after the laser emitter has been in a burst-off state (e.g., because the ONU is in the burst-off state). In the burst-off state, the current through the laser emitter is reduced such that an amount of optical power outputted by the laser emitter is less than an optical power threshold (e.g., including zero optical power). The controller is also configured to subsequent to the pre-burst state, configure the laser driver and the optical attenuator in a burst-on state. In the burst-on state, the controller configures the laser driver to flow current through the laser emitter to output modulated optical signal, and the controller configures the optical attenuator to be in the non-attenuation state. In the burst-on state, the current through the laser emitter is increased such that the amount of optical power outputted by the laser emitter is greater than or equal to the optical power threshold.

The example techniques may be considered as providing a solution to the BMSE (burst-mode spectral excursion) problem using a shutter (e.g., optical attenuator) and solving related problems with other techniques that use the optical attenuator (e.g., by leaving the laser emitter on during burst-off state). For instance, by configuring ONUs in a pre-burst state (e.g., an intermediate state between burst-off and burst-on), it may be possible to allow the laser emitter wavelength to stabilize before the ONU transitions to be burst-on state. Also, because the laser emitter from most all other ONUs is outputting optical power below an optical power threshold (including zero optical power) when an ONU is in the burst-on state, there may be very little to no crosstalk from most of the other ONUs, except possibly the next ONU that is transitioning to the pre-burst state while the current ONU is in the burst-on state. Moreover, because the laser emitters are configured in a state to deliver less power than an optical power threshold (e.g., including being off), there is power savings, and additional power budget is available for other components of the ONUs.

FIG. 1 is a block diagram illustrating a network, in accordance with one or more aspects of this disclosure. For example, FIG. 1 illustrates a multiple wavelength system 100. One example of system 100 is an ITU-T G.989 (NGPON-2) conforming system. System 100 includes OLTs 102A-102N. Examples of OLTs 102 and components that coupled to OLTs 102 for voice, data, and video are described in more detail with respect to FIG. 2.

In system 100, each one of OLTs 102A-102N may transmit downstream optical signals and receive upstream optical signals at specific wavelengths that are different from one another. For example, OLT 102A transmits optical signals at a first downstream wavelength and receives optical signals at a first upstream wavelength. OLT 102N transmits optical signals at a second downstream wavelength and receives optical signals at a second upstream wavelength. Each of these downstream wavelengths is different than each of the other downstream wavelengths and each of the upstream wavelengths. Each of these upstream wavelengths is different than each of the other upstream wavelengths and each of the downstream wavelengths.

In some examples, OLTs 102A-102N may not all be the product of the same company. In some examples, OLTs 102A-102N may be located in different geographical locations. In some examples, OLTs 102A-102N may be located together within the same chassis or located together within proximity of one another. In some examples, rather than having multiple OLTs 102A-102N, system 100 may include one OLT with multiple transmitters and receivers where each transmitter is configured to transmit downstream optical signals at different downstream wavelengths, and each receiver is configured to receive upstream optical signals at different upstream wavelengths (where the downstream and upstream wavelengths are also different). For ease of description, the techniques are described with examples that include multiple OLTs (e.g., OLTs 102A-102N).

Each one of OLTs 102A-102N is associated with (e.g., assigned to) a set of optical network units (ONUs). For example, OLT 102A is associated with set of ONUs 106A, and OLT 102N is associated with set of ONUs 106B. Set of ONUs 106A includes ONUs 108A-108N and set of ONUs 106B includes ONUs 110A-110N. Examples of ONUs 108A-108N and 110A-110N and the subscriber devices they are connected to is described in more detail in FIG. 2.

In some examples, the upstream and downstream capabilities of ONUs 108A-108N and 110A-110N may be tunable. For instance, as described above, OLT 102A may be configured to transmit downstream optical signals with a first downstream wavelength and configured to receive upstream optical signals with a first upstream wavelength. In the example of FIG. 1, ONUs 108 may be tuned to transmit optical signals at the first upstream wavelength and receive optical signals at the first downstream wavelength. Similarly, ONUs 110 may be tuned to transmit optical signals at the second upstream wavelength at which OLT 102N is configured to receive optical signals, and tuned to receive optical signals at the second downstream wavelength at which OLT 102N is configured to transmit optical signals.

In some examples, ONUs 108 and 110 may be tunable for distinct wavelengths. For instance, ONUs 108 and 110 may be tunable to transmit upstream optical signals with wavelength X or with wavelength Y, and not wavelengths intermediate to X and Y, or wavelengths other than X or Y. In this example, OLT 102A may be configured to receive upstream optical signals with wavelength X, and OLT 102B may be configured to receive upstream optical signals with wavelength Y. The same may be true for the tuning for the reception of downstream optical signals.

As illustrated, system 100 includes wave division multiplexer (WDM) 104. In the downstream, WDM 104 receives downstream optical signals at respective wavelengths from OLTs 102A-102N, and filters the downstream optical signals so that ONUs 108 only receive the downstream optical signals with the first downstream wavelength, and so that ONUs 110 only receive the downstream optical signals with the second downstream wavelength. In the upstream, WDM 104 receives upstream optical signals at respective wavelengths from ONUs 108 and ONUs 110, and filters the upstream optical signals so that OLT 102A only receives the optical signals with first upstream wavelength, and so that OLT 102N only receives the optical signals with the second upstream wavelength.

As illustrated in FIG. 1, in some examples, system 100 includes splitter/combiner 105. Splitter/combiner 105 may be an active (e.g., requires power) or passive (e.g., does not require power) splitter/combiner. In the downstream, splitter/combiner 105 splits the optical signal from WDM 104 and outputs the optical signals to respective ONUs 108 and 110. In the upstream, splitter/combiner 105 receives optical signals from respective ONUs 108 and 110, combines the optical signals, and outputs the resulting optical signal to WDM 104. Although a single splitter/combiner 105 is illustrated, there may be a plurality of splitters/combiners 105 in system 100.

Although a single WDM 104 is illustrated in FIG. 1, in some examples there may be multiple WDMs located throughout system 100. As one example, a first WDM may couple to OLTs 102A-102N, and couple to a second WDM via a first fiber link and a third WDM via a second fiber link. The second WDM may be proximate to ONUs 108, and the third WDM may be proximate to ONUs 110. Other such configurations are possible to allow OLTs 102A-102N to communicate with ONUs 108A-108N and 110A-110N.

In some examples, WDM 104 may not be needed. In such examples, a transmitter at OLTs 102 may output to splitter/combiner 105. Also, in some examples, where there is only one OLT 102, WDM 104 may not be needed or WDM 104 may be part of the one OLT 102. Various other configurations of system 100 that include one or more OLTs 102, WDMs 104, and splitters/combiners 105 may be possible and the techniques described in this disclosure are not limited to any particular configuration of system 100.

As described in more detail, ONUs 108 and 110 may be configured to transition from a burst-off state to a pre-burst state, and then a burst-on state. OLTs 102 may be configured to assign timeslots to each of respective ONUs 108 and 110 that define when ONUs 108 and 110 are to start and stop the burst-on state. In one or more examples, prior to the time of the burst-on state (e.g., 1 to 10 micro-seconds before the burst-on state), controllers of ONUs 108 and 110 may configure the laser drivers of ONUs 108 and 110 to flow current through their respective laser emitters and configure an optical attenuator to attenuate the optical signal, and then in the burst-on state, the controllers may configure the laser driver of ONUs 108 and 110 to flow current through respective laser emitters to output an optical signal and configure the optical attenuator to not attenuate the optical signal. In one or more examples, in the burst-off state, the laser emitters of respective ONUs 108 and 110 may be configured to output little to no optical power (e.g., less than an optical power threshold).

Figure 2:
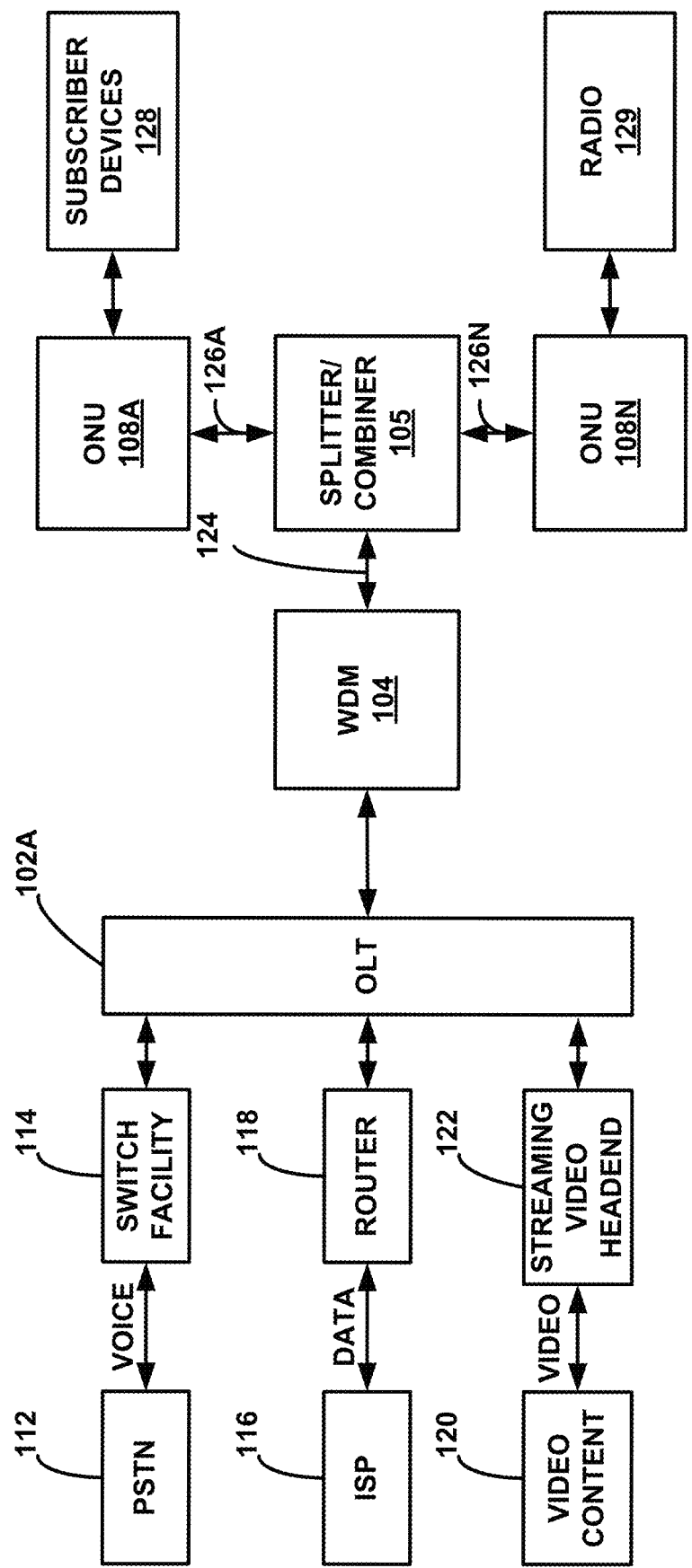
FIG. 2 is a block diagram illustrating additional detail for a portion of the network of FIG. 1, in accordance with one or more aspects of this disclosure.

FIG. 2 is a block diagram illustrating additional detail for a portion of the network of FIG. 1, in accordance with one or more aspects of this disclosure. For example, FIG. 2 illustrates the connections to OLT 102A and ONUs 108 in greater detail. OLT 102N and ONUs 110 may be similarly configured. In some examples, such as those other than NGPON-2, the example illustrated in FIG. 2 may be configured as its own PON network. The example techniques are applicable to examples where system 100 is an NGPON-2 system or other PON systems. Moreover, example techniques are not so limited to PON systems, and can be extended to other types of networks such as cable or digital subscriber line (DSL) based networks, or Active Ethernet which may be considered as optical transmission and reception in accordance with the Ethernet protocol.

Active Ethernet is defined by the IEEE 802.3ah standard (e.g., in clause 59 of the 802.3ah standard). Examples of network 10 also include shared-medium transports such as WiFi and RF/DOCSIS.

As shown in FIG. 2, OLT 102A may deliver voice, data and video content (generally "information") to a number of network nodes via optical fiber links. In some examples, OLT 102A may be arranged to deliver Internet Protocol television (IPTV) and other high speed information (e.g., information transmitted at approximately 200 Mbps or higher). System 100 may conform to any of a variety of PON standards, such as the broadband PON (BPON) standard (ITU G.983), Ethernet PON (EPON), the gigabit-capable PON (GPON) standard (ITU G.984), or 10 giga-bit NGPON, as well as future PON standards under development by the Full Service Access Network (F SAN) Group, such as 10G GPON (ITU G.987), or other organizations.

OLT 102A may receive voice information, for example, from the public switched telephone network (PSTN) 112 via a switch facility 114. In addition, OLT 102A may be coupled to one or more Internet service providers (ISPs) 116 via the Internet and a router 118. As further shown in FIG. 2, OLT 102A may receive video content 120 from video content suppliers via a streaming video headend 122. Video also may be provided as packet video over the Internet. In each case, OLT 102A receives the information, and distributes it to WDM 104.

WDM 104 then distributes the information to splitter/combiner 124 via fiber optic link 124, and splitter/combiner 105 outputs to ONUs 108A-108N (collectively referred to as "ONUs 108") via respective fiber optic links 126A-126N (collectively referred to as "fiber optic links 126"). Fiber link 124 is an example of a feeder fiber link and fiber optic links 126 are examples of drop fiber links (also called distribution fiber links). Also, ONUs 108 may be referred to as optical network terminals (ONTs).

One or more of ONUs 108 may reside at or near a subscriber premises. In some examples, one or more ONUs 108 may be coupled to a wireless transmission/reception device, like a radio, for use in wireless communication systems, such as 5G networks, 4G networks including 4G long term evolution (LTE) networks, and the like. For instance, one or more ONUs 108 may reside on communication towers used for wireless communication systems. The one or more ONUs 108 may receive upstream data from one or more radios, that receive upstream data from devices connected to the wireless communication system, and transmit downstream data to the one or more radios, that transmit the downstream data to devices connected to the wireless communication system.

For instance, ONU 108A resides at or near a subscriber premises that includes one or more subscriber devices 128. The subscriber premises may be a home, a business, a school, or the like. A single ONU 108 may be capable of transmitting information to and receiving information from one or more subscriber premises.

As illustrated in FIG. 2, ONU 108N may reside at or near a communication tower and be connected to radio 129. Radio 129 may communicate in accordance with time division duplex mode (TDD) mode. In TDDM, radio 129 may transmit and receive data on the same frequency. Accordingly, radio 129 may not be configured to transmit and receive data at the same time since the same frequency is used for transmission and reception. Rather than transmitting and receiving data at the same time, radio 129 "ping-pongs" between transmitting and receiving. ONU 108N may be configured to receive downstream data and transmit upstream data at the same time, but radio 129 may not be able to further transmit the downstream data, received from ONU 108N, and receive the upstream data at the same time.

In some examples, the amount of downstream data that radio 129 receives may be greater than the amount of upstream data that radio 129 is to transmit. As one example, in operation, radio 129 may receive downstream data for approximately 80% of the time, 75% of the time, or 60% of the time, and may transmit upstream data for the remaining amount of time (e.g., 20%, 25%, or 40%), as a few non-limiting examples.

For ease of description, ONU 108A is illustrated as being connected to subscriber devices 128 and ONU 108N is illustrated as being connected to radio 129. In some examples, there may be other ONUs 108 connected to other subscriber devices and other ONUs 108 connected to other radios. In some examples, ONUs 108 may be connected only to radios 129, and in some examples, ONUs 108 may be connected only to subscriber devices 128. There may be various configurations, and the techniques described in this disclosure are not limited to any particular configuration.

As illustrated, a single ONU 108 may directly transmit information to or receive information from one or more subscriber devices 128 within the subscriber premises. Examples of the subscriber devices 128 include, but are not limited to, one or more computers (e.g., laptop and desktop computers), network appliances, televisions, game consoles, set-top boxes, wireless devices, media players or the like, for video and data services, and one or more telephones for voice services. Subscriber devices 128 may also include household appliances such as furnaces, washer and dryers, freezers, refrigerators, thermostats, lights, security systems, and the like.

OLT 102A transmits downstream information to and receives upstream information from ONUs 108 via WDM 104. Downstream information may be considered to be information transmitted by OLT 102A and received by ONUs 108. Upstream information may be considered to be information transmitted by each one of ONUs 108 and received by OLT 102A. As illustrated in FIG. 2, WDM 104 may be coupled to splitter/combiner 105, which is coupled to each one of ONUs 108 via respective optical fiber links 126.

In some examples, WDM 104 may be a passive WDM. A passive WDM may not need to be powered. For downstream transmission, including voice, video, and data information from OLT 102A, WDM 104 receives the downstream information and splits the downstream information for downstream transmission to ONUs 108 via respective fiber links 126, such as in examples where splitter/combiner 105 is not used. For upstream information, including voice and data information from each one of ONUs 108, WDM 104 receives upstream information from ONUs 108 via respective fiber links 126 and combines the upstream information for transmission to OLT 102A, such as in examples where splitter/combiner 105 is not used. Similar to WDM 104, in some examples, splitter/combiner 105 may be a passive splitter/combiner.

In some examples, WDM 104 may not be a passive WDM, but rather an active WDM. In these examples, WDM 104 may be powered locally. In these examples, WDM 104 may function as a switch, router, multiplexer, and the like. Similar to WDM 104 being active, in some examples, splitter/combiner 105 may be an active splitter/combiner.

In some examples, system 100 may conform to the time wavelength division multiplexing (TWDM)-PON, which is an option within the NGPON2 ITU specification in the G.989 series (e.g., ITU-T G.989.2—NG-PON2 PHY layer and ITU-T G.989.3—NG-PON2 TC layer). TWDM-PON uses dense wavelength division multiplexing (DWDM) laser emitters operating in burst mode. DWDM laser emitters normally operate in a continuous mode and this new use of DWDM laser emitters in burst mode creates a challenge which has been called "Short Term Spectral Excursion" or STSE.

STSE is a phenomenon which happens when a burst mode laser emitter goes from a fully 'off' state to an 'on' state, i.e. sending a burst onto the optical distribution network (ODN), such as the ODN formed by fiber links 126, WDM 104, fiber link 124, and splitter/combiner 105. Since the TWDM upstream is (by definition) bursty (e.g., on for short period in burst-on state, and then off in burst-off state) and the laser emitters emit virtually no light in between bursts, some techniques apply near zero current to laser emitters that are not actively transmitting (e.g., laser drivers of ONUs in the burst off state apply near zero (or possibly zero) current to the laser emitters when in the burst-off state).

Figure 3:
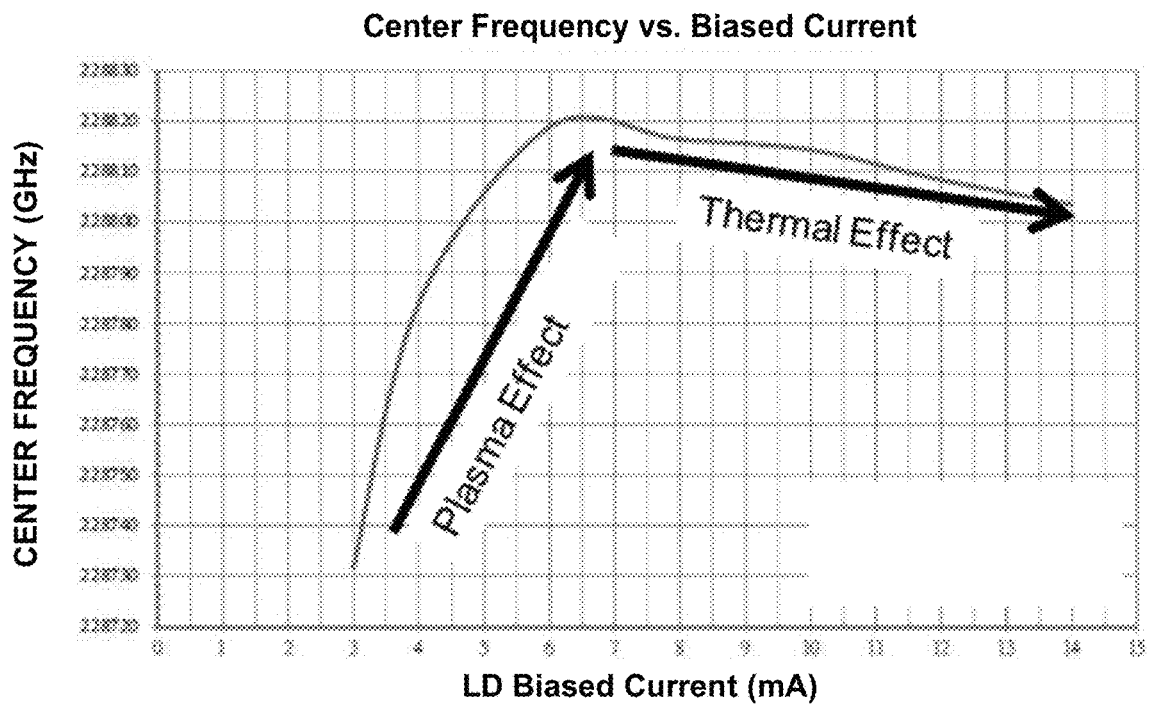
FIG. 3 is a graph illustrating an example of impact of wavelength from current injection.
Figure 4:
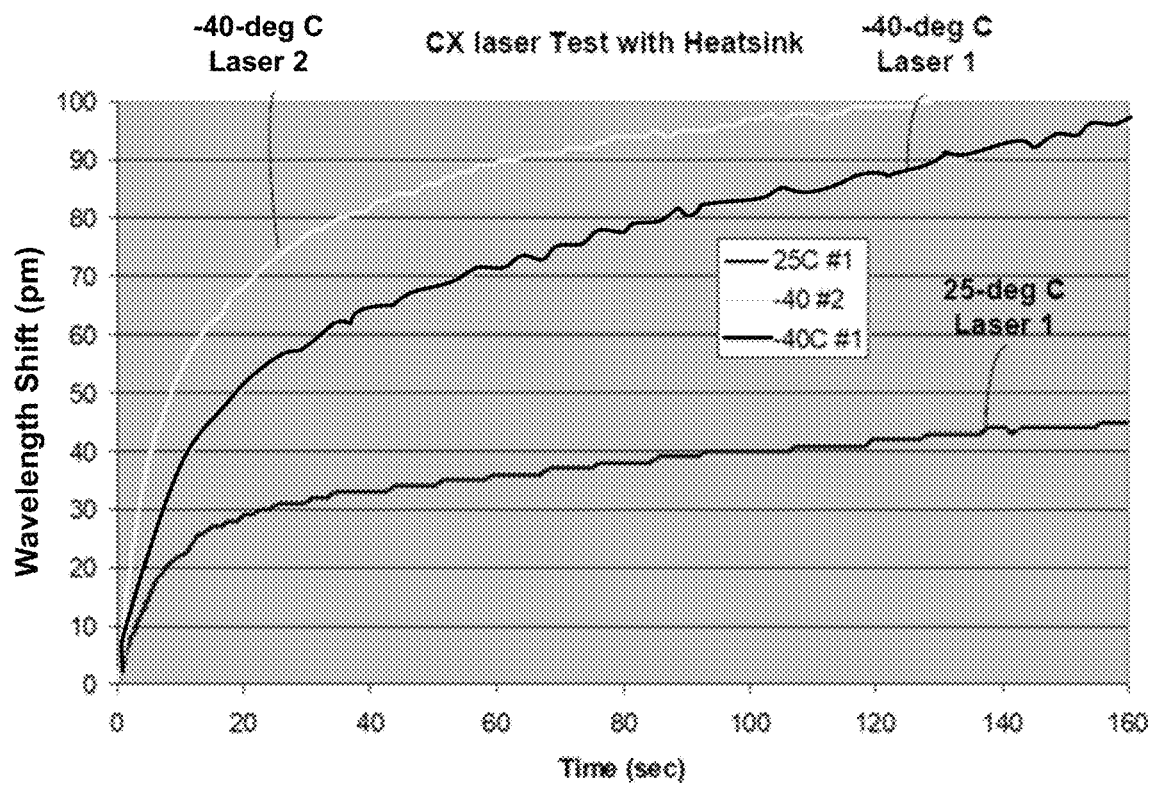
FIG. 4 is a graph illustrating an example of variation of laser emitter wavelength due to temperature increase from laser drive current—long time scale.
Figure 5:
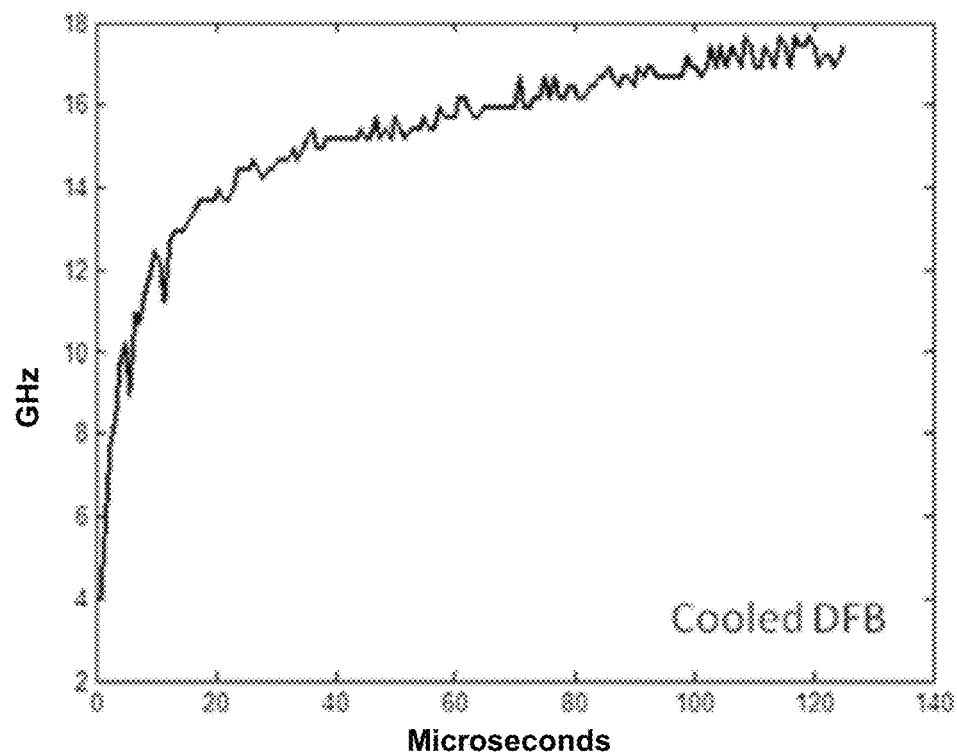
FIG. 5 is a graph illustrating variation of laser emitter wavelength due to temperature increase from laser driver current—short time scale.

However, when current is applied to a laser emitter (e.g., when the ONUs transition to burst-on state), there is a wavelength shift as shown in FIGS. 3-5. For example, FIG. 3 is a graph illustrating an example of impact of wavelength from current injection, FIG. 4 is a graph illustrating an example of variation of laser emitter wavelength due to temperature increase from laser drive current—long time scale, and FIG. 5 is a graph illustrating variation of laser emitter wavelength due to temperature increase from laser driver current—short time scale.

This shift is a more exaggerated form of the 'chirp' which occurs when laser emitters are modulated from a 0 bit level to a 1 bit level. The 0 bit in non-return-to-zero (NRZ) modulation may not really be 'zero' light but a lower power level of the light. The ratio between the 1 level and the 0 level in decibels is called the Extinction Ration (ER).

Figure 6:
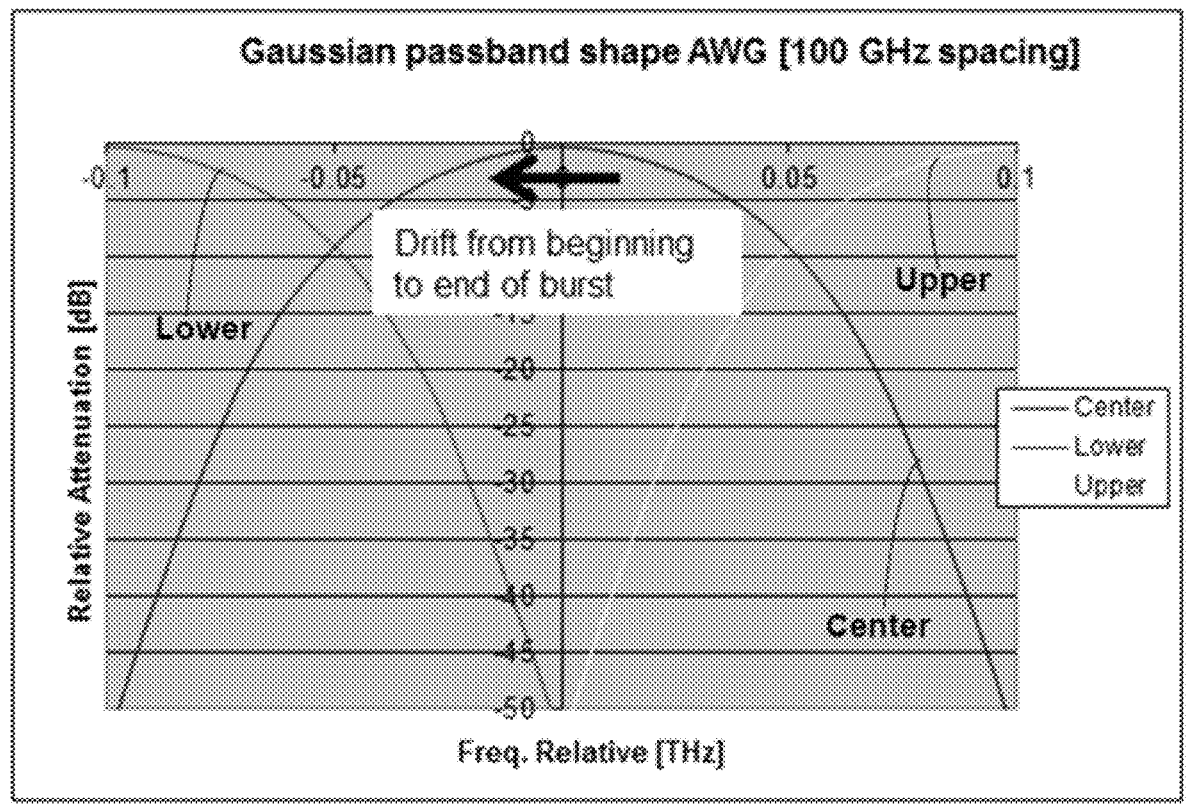
FIG. 6 is a graph illustrating movement of laser emitter wavelength over burst duration shown within the passband of a Gaussian shaped wavelength multiplexer.

This shift in the wavelength of the laser emitter is initially due to the plasma effect and later due to thermal drift due to the heating effect of current injection into the laser emitter as seen in FIG. 1. This effect may cause the laser emitter to shift wavelength into a non-optimal part of the WM (wavelength multiplexer) filter shape (e.g., of WDM 104), and if large enough, may even cause leakage of optical power into an adjacent channel as shown in FIG. 6, which is a graph illustrating movement of laser emitter wavelength over burst duration shown within the passband of a Gaussian shaped wavelength multiplexer. As one example, the shift in the wavelength of the laser emitter of ONU 108A (as one example) may make it so that WDM 104 cannot multiplex the signal because the wavelength is in a wavelength range that WDM 104 is not well suited to multiplex.

As another example, the shift in the wavelength of the laser emitter of ONU 108A (as one example) may be sufficient that OLT 102N determines that the signal is for OLT 102N. For example, assume that ONU 110A is assigned a first wavelength and ONU 108A is assigned a second wavelength. One way for OLT 102N to determine that the optical signal is from ONU 110A is based on a filtering of wavelength and allowing signals having the first wavelength to pass through. If, however, the wavelength of the laser emitter of ONU 108A shifts so much that the wavelength becomes equal to the first wavelength instead of the second wavelength, then it is possible that OLT 102N may incorrectly determine that the signal from ONU 108A is for OTL 102N and from ONU 110A.

There have been example solutions described for addressing the wavelength drift (e.g., spectral excursion). Some example techniques include the following.

A first example solution includes using a laser emitter with fast wavelength tuning control like a Distributed Bragg Reflector (DBR), to tune the laser emitter in the opposite direction from the unintended burst mode drifts. Examples of the first solution are described in "Suppression of Thermal Wavelength Drift in Super-Structure Grating Distributed Bragg Reflector (SSG-DBR) Laser with Thermal Drift Compensator," IEEE JOURNAL OF SELECTED TOPICS IN QUANTUM ELECTRONICS, VOL. 13, NO. 5, SEPTEMBER/OCTOBER 2007.

A second example solution includes using a laser emitter heater strip that keeps the laser emitter at warm between bursts and reduces heating as the laser emitter self-heats as current is injected for lasing purposes. Examples of the second solution are described in U.S. Patent Publication No. 2015/0063812.

A third example solution includes pretuning the laser emitter to an offset from the center of the wavelength multiplexer filter to minimize the deviation of the laser emitter from the filter center though the lifetime of a burst. Examples of the third solution are described in "Short Term Spectral Excursion", Calix contribution at Bad Nauheim, September 2013

A fourth example solution includes pre-emphasis of "laser emitter turn on current" to quickly heat the laser emitter to reduce the duration of the wavelength drift. This technique may not eliminate the drift, but may reduce the impact of drift. Examples of the fourth solution are described in "Wavelength Drift of Burst-Mode DML for TWDM-PON [Invited], J. OPT. COMMUN. NETW./VOL. 7, NO. 1/JANUARY 2015, Wolfgang Poehlmann, Doutje van Veen, Robert Farah, Thomas Pfeiffer, and Peter Vetter.

A fifth example technique is to use of a shutter (such as in the form of a semiconductor optical amplifier (SOA), similar to an external modulator) to avoid the change in wavelength of the laser emitter by allowing the laser emitter to remain on continuously and the off-burst state is achieved by eliminating current to the SOA which acts as a shutter between bursts. Examples of the fifth solution are described in "High extinction switching of SOAs for in-band crosstalk reduction in PON", ELECTRONICS LETTERS 3 Jul. 2008 Vol. 44 No. 14, C. Antony, G. Talli, P. D. Townsend, J. Bauwelinck, D. W. Smith and I. Lealman. In the fifth solution, the shutter should have enough attenuation to prevent any significant laser emitter power from leaking into the fiber. However, the shutter (which is an example of an optical attenuator) may not provide sufficient attenuation, especially where all ONUs that are to be in burst off are outputting optical power. For instance, the shutter on each of the ONUs may attenuate the optical signal from respective ONUs; however, even if there is sufficient attenuation on one ONU, there may still be too much crosstalk because the optical signals from all of the ONUs, even if attenuated, are additive.

This disclosure describes example techniques of using an optical attenuator (e.g., SOA, a micro-electro-mechanical systems (MEMs) attenuator, a liquid crystal shutter, and the like) without some of the drawbacks of the fifth solution (e.g., where the laser emitter is also kept on even in burst-off and the shutter is used to attenuate the optical signal). For example, in this disclosure, during a burst-off state, the laser emitter is outputting optical power lower than an optical power threshold (e.g., outputting zero optical power). In the pre-burst state, the laser emitter is outputting optical power but the optical attenuator attenuates the optical power. In the pre-burst state, there is sufficient time for the wavelength of the laser emitter to stabilize. Then, the ONU transitions to the burst-on state, and the optical attenuator is configured to not attenuate the optical power.

Accordingly, this disclosure addresses the issues with the fifth example solution and addresses the problem of an SOA (or any shutter including a mechanical shutter) that does not supply the desired level of attenuation when the ONU is in a burst-off state. Moreover, the fifth solution may consume unnecessary power since the laser emitter is outputting, which is then attenuated by the attenuator, even when the ONU is to be off. Unnecessary power consumption may also be present in the second solution where power is used for heating a strip that in turn heats the laser emitter when the laser emitter is not outputting. As described in more detail, the example techniques utilize a pre-burst state to allow the laser emitter to stabilize to its wavelength while an optical attenuator attenuates the output from the laser.

In the examples described in the document for the fifth solution, the SOA used as an attenuator produces 67 dB of attenuation. However, some designs have attenuations of only 50 dB. Given the large (15 dB) attenuation range of an ODN (optical distribution network), the laser emitters in an off-burst state (e.g., ONU in the burst-off state) can be all on low attenuation legs of the ODN while the victim laser emitter (e.g., the ONU that is in the burst-on state) is on a high attenuation leg, which exacerbates the problem of residual off-burst light because the crosstalk ratio becomes high. For instance, assume ONU 108A is the ONU that is burst-on state, it is possible that the attenuation between ONU 108A and WDM 104 is greater than the attenuation between ONUs 108B-108N and WDM 104. In this case, because of the greater attenuation between ONU 108A and WDM 104, the impact of the crosstalk from ONUs 108B-108N may be greater.

Another reason off-burst light should be so low is that all the ONUs 108 in a burst-off state (63 ONUs 108 in a 64-way ODN) are leaking off-burst light which sums together to the OLT 102A and competes with the on-burst victim signal (e.g., output from ONU 108A) on the high attenuation leg of the ODN. In other words, assume only the output from ONU 108A is to be transmitted to splitter/combiner 105. However, if there is leakage from the attenuators and all other ONUs 108 are outputting (e.g., to keep respective laser emitters warm), then there may be additive noise from the ONUs 108 that interfere with the optical signal from ONU 108A.

In accordance with this disclosure, considering that an optical attenuator having an attenuation state and a non-attenuation state (e.g., such as the SOA) is used to shutter the short-term spectral excursion of the laser emitter as the laser emitter goes from burst-off state to a burst-on state, the optical attenuator needs to attenuate only for a short time period. That period where attenuation is needed by the optical attenuator may be the first microsecond or two needed for the laser emitter to adequately stabilize to its wavelength after being turned on.

Accordingly, ONUs 108 and 110 may be configured to a 'pre-burst' state (in addition to the burst-off and burst-on states) where the optical attenuator is providing attenuation (e.g., in the attenuation state), but the laser emitter is on. This differs from the burst-off state where the laser emitter is off. In the burst-off state, the optical attenuator may be in the attenuation state or the non-attenuation state since the laser emitter is off, but it may be beneficial to keep the optical attenuator in the attenuation state. In the burst-off state, the burst-off power can be arbitrarily low because the current to the laser emitter can be zero or very little.

In the pre-burst state, the power that will go onto the ODN (e.g., via fiber links 126) will be that of the laser emitter power (e.g., the optical power outputted by the laser emitter) minus that of attenuation provided by the optical attenuator. Again, in the pre-burst state, the optical attenuator is in the attenuation state and the laser emitter is outputting optical power greater than or equal to an optical power threshold. The difference between pre-burst power (e.g., optical power from the laser emitter when the ONU is in the pre-burst state) and off-burst power (e.g., laser emitter is not outputting optical power) is that if the pre-burst time is short enough, it will impact only one ONU burst, i.e. the one immediately preceding. The impact will be from a maximum of one ONU versus all the ONUs in the ODN (minus 1). Therefore, the pre-burst power can be at least 16 times higher than the off-burst power, assuming at least 16 ONUs per ODN (assuming an equal power penalty for both off-burst and pre-burst interference effects). The G.989.2 specification assumes 64 ONUs in specifying the off-burst power called WNE-PSD (when not enabled power spectral density). Moreover, the off-burst power can be truly zero which allows all the power budget penalty to be used for the pre-burst power.

Figure 7:
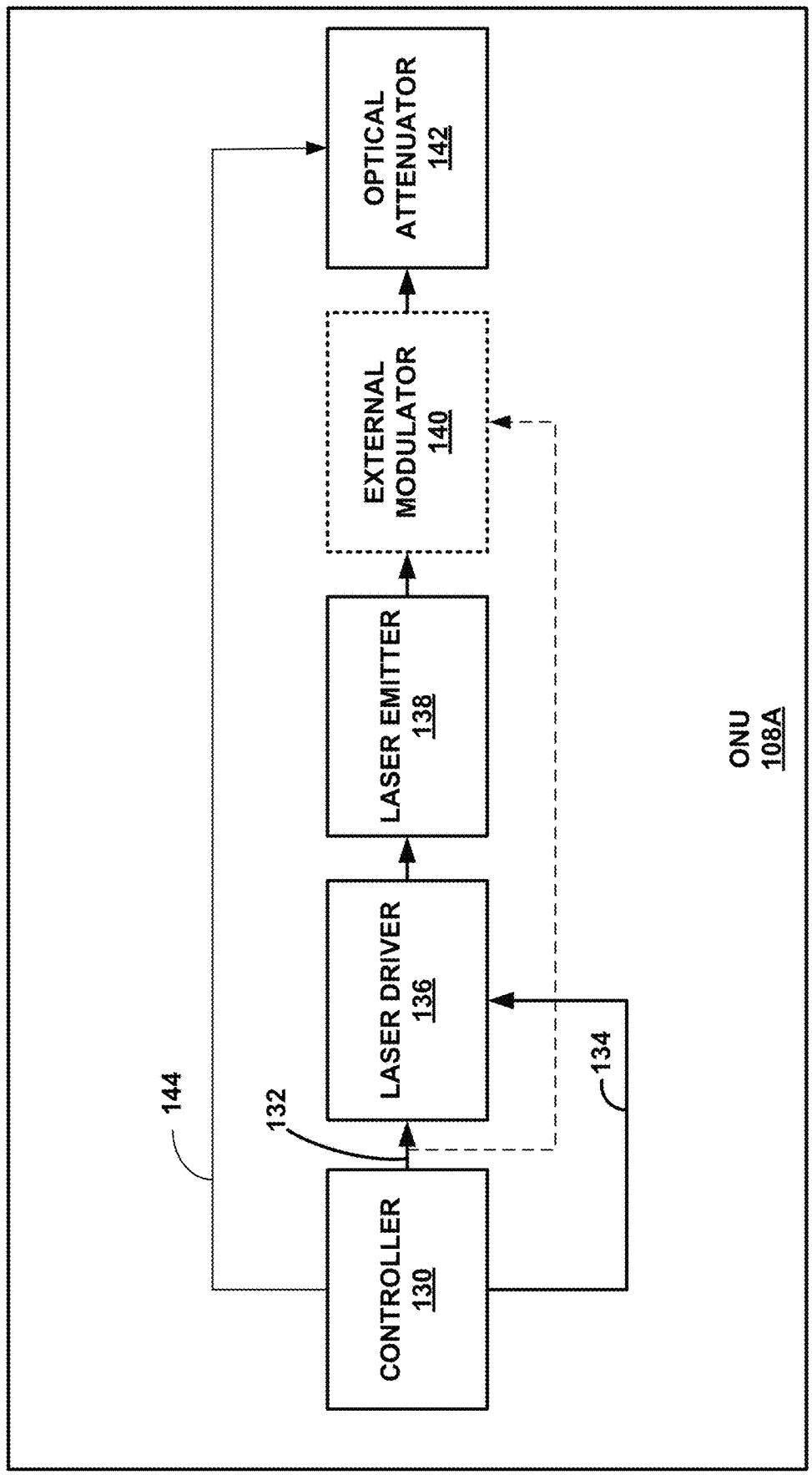
FIG. 7 is a block diagram illustrating an example of an optical network unit (ONU) in accordance with the techniques described in this disclosure.

FIG. 7 is a block diagram illustrating an example of an optical network unit (ONU) in accordance with the techniques described in this disclosure. For purposes of illustration, FIG. 7 illustrates ONU 108A in greater detail. The other ONUs may be substantially similar to ONU 108A.

As illustrated, ONU 108A includes controller 130, laser driver 136, laser emitter 138, optional external modulator 140, and optical attenuator 142 for upstream transmission. Although external modulator 140 and optical attenuator 142 are shown as part of ONU 108A, the techniques are not so limited. In some examples, one or both of external modulator 140 and optical attenuator 142 may be external to ONU 108A.

In addition, ONU 108A includes components for receiving downstream transmission from OLT 102A, such as a photodiode, a transimpedance amplifier (TIA), limiting amplifier, and a clock-and-data recovery (CDR) unit. The components used for receiving optical signals are not illustrated for ease of illustration. Controller 130 may be a media access control (MAC) controller. In some examples, controller 130 may control both the upstream transmission and downstream reception for ONU 108A. In some examples, ONU 108A may include separate controllers for upstream and downstream.

Controller 130 may be implemented as fixed-function circuits, programmable circuits, or a combination thereof. Fixed-function circuits refer to circuits that provide particular functionality and are preset on the operations that can be performed. Programmable circuits refer to circuits that can programmed to perform various tasks and provide flexible functionality in the operations that can be performed. For instance, programmable circuits may execute software or firmware that cause the programmable circuits to operate in the manner defined by instructions of the software or firmware. Fixed-function circuits may execute software instructions (e.g., to receive parameters or output parameters), but the types of operations that the fixed-function circuits perform are generally immutable. In some examples, the one or more of the units may be distinct circuit blocks (fixed-function or programmable), and in some examples, the one or more units may be integrated circuits.

Controller 130 may include arithmetic logic units (ALUs), elementary function units (EFUs), digital circuits, analog circuits, and/or programmable cores, formed from programmable circuits. In examples where the operations of controller 130 are performed using software executed by the programmable circuits, memory may store the object code of the software that controller 130 receives and executes.

Controller 130 may output data from subscriber device 128A, during timeslots assigned to ONU 108A. For example, OLT 102A may assign ONU 108A timeslots that define when ONU 108A is to be in the burst-on state and when ONU 108A is to be in the burst-off state. In the burst-on state, controller 130 may output a control signal, via control line 134, that configures laser driver 136 to output current through laser emitter 138. Controller 130 outputs data received from subscriber device 128A to laser driver 136 via data line 132.

In some examples, control line 134 may be differential control lines. During timeslots when ONU 108A is to output an optical signal representing the data outputted by subscriber devices 128A, controller 130 may output a voltage as a control signal via control line 134 to instruct laser driver 136 to energize (turn on) laser emitter 138. Laser emitter 138 may be a DWDM laser emitter. Laser driver 136 may control the amount of current that flows through laser emitter 138 to cause laser emitter 138 to output the optical signal that represents the data from subscriber devices 128A.

To cause laser emitter 138 to output the optical signal that represents the data form subscriber devices 128A, laser driver 136 may cause a bias current and a modulation current to flow through laser emitter 138. The bias current is a DC current that flows through laser emitter 138 during the burst-on state. The modulation current rides on-top of the bias current and represents the logic ones and zeros in the data. For example, if the data from subscriber device 128A is a logic one, laser driver 136 may cause a modulation current to flow through laser emitter 138 in addition to the bias current. Therefore, the current through laser emitter 138 for a logic one is modulation current amplitude plus bias current amplitude. If the data from subscriber device 128A is a logic zero, laser driver 136 may not cause a modulation current to flow through laser emitter 138. Therefore, the current through laser emitter 138 for a logic one is the bias current amplitude. In this way, laser driver 136 may cause current to flow through laser emitter 138 that represents the logic ones and zeros of the data from subscriber device 128A.

When a modulation plus bias current (e.g., current for a logic one) flows through laser emitter 138, laser emitter 138 outputs optical power at a first level and when the bias current (e.g., current for a logic zero) flows through laser emitter 138, laser emitter 138 outputs optical power at a second level. The optical power at the first level represents a logic one and the optical power at the second level represents a logic zero.

The above example technique of generating the optical signal is referred to as direct modulation, and external modulator 140 is not needed. When external modulator 140 is not needed, the output of laser emitter 138 is coupled to optical attenuator 142.

However, in some examples, as illustrated with dashed lines, external modulator 140 may be used. External modulator 140 may be an optical device that splits incoming light down two paths. By controlling the delay of the two paths, external modulator 140 can sum the lights together to represent a logic one or not sum the lights together to represent a logic zero. In examples where external modulator 140 is used, laser driver 136 may be configured to set the bias current level of laser emitter 138 and the modulation of the output of laser emitter 138 may be set by external modulator 140. External modulator 140 is one example of an external modulator and other types of external modulators may be used. For instance, external modulator 140 is an Electro-Absorption Modulator.

As illustrated, ONU 108A includes optical attenuator 142. Optical attenuator 142 may be a semiconductor optical amplifier (SOA), a MEMs, a liquid crystal shutter, and the like. Optical attenuator 142 may be configured to be in an attenuation state and a non-attenuation state. Controller 130 may be configured to output an attenuation state command via control line 144 that configure optical attenuator 142 in the attenuation state or the non-attenuation state. In the attenuation state, optical attenuator 142 blocks (e.g., shutters) the output of laser emitter 138 or external modulator 140 (e.g., by 50 dB or more). In the non-attenuation state, optical attenuator 142 allows the output of laser emitter 138 or external modulator 140 to output without attenuation. In examples where optical attenuator 142 is SOA, optical attenuator 142 may amplify the optical signal outputted by laser emitter 138 or external modulator 140 when optical attenuator 142 is in the non-attenuation state.

During burst-off state, controller 130 may output a voltage as a control signal via control line 134 to instruct laser driver 136 to de-energize (turn off) laser emitter 138. Also, controller 130 may output an attenuation state command via control line 144 to configure optical attenuator 142 in the attenuation state. However, configuring optical attenuator 142 in the attenuation state is not necessary.

As described in this disclosure, after the burst-off state and before the burst-on state, ONU 108A may be configured in the pre-burst state. For example, controller 130 may determine when ONU 108A is to transition to the burst-on state (e.g., based on timeslots OLT 102A had assigned ONU 108A and had transmitted to ONU 108A at startup). Controller 130 may determine a time a few microseconds before the burst-on time (e.g., 1 to 10 micro-seconds, which is approximately the amount of time needed for laser emitter 138 to stabilize to its wavelength). At a time a few microseconds before the burst-on time, controller 130 may configure ONU 108A in the pre-burst state.

In the pre-burst state, controller 130 may configure optical attenuator 142 in the attenuation state. In some examples, to configure optical attenuator 142 in the attenuation state, controller 130 may not need to perform any active steps because it is possible that optical attenuator 142 was in the attenuation state during burst-off state. In such examples, configuring optical attenuator 142 in the attenuation state includes ensuring that optical attenuator 142 is in the attenuation state.

Also, in the pre-burst state, controller 130 may configure laser driver 136 to cause laser emitter 138 to output optical power greater than or equal to an optical power threshold. For example, for direct modulation, controller 130 may configured laser driver 136 to flow the bias current through laser emitter 138, and in addition, controller 130 may output to laser driver 136 a data preamble, a pseudo-random bitstream, a series of one-zero pattern (e.g., 001100110011 for 50% duty cycle), a noisy signal, or any other type of predefined signal. Laser driver 136 may then modulate laser emitter 138 accordingly, but very little of this signal will flow into fiber link 126A because optical attenuator 142 is in the attenuation state. Where external modulator 140 is used, laser driver 136 may cause the bias current to flow through laser emitter 138 and controller 130 may output a data preamble, a pseudo-random bitstream, a series of one-zero pattern (e.g., 001100110011 for 50% duty cycle), a noisy signal, or any other type of predefined signal to external modulator 140. As yet another example, in direct modulation, the average current that flows through laser emitter 138 in the burst-on state is bias current+(modulation current/2). In some examples, controller 130 may be configured to set the bias current that laser driver 136 flows through laser emitter 138 to be equal to the bias current during burst-on state plus (modulation current during burst-on state/2). Controller 130 may set the current level through the automatic power control (APC) loop of laser driver 136 or by setting the resistance level of the resistors used to set the bias current.

Accordingly, controller 130 may be configured to configure laser driver 136 and optical attenuator 142 in a pre-burst state. In the pre-burst state, controller 130 configures laser driver 136 to flow current through laser emitter 138, and controller 130 configures optical attenuator 142 to be in the attenuation state after laser emitter 138 has been in a burst-off state. In the burst-off state, the current through laser emitter 138 is reduced such that an amount of optical power outputted by laser emitter 138 is less than an optical power threshold (e.g., include zero optical power). Subsequent to the pre-burst state, controller 130 may configure laser driver 136 and optical attenuator 142 in a burst-on state. In the burst-on state, controller 130 configures laser driver 136 to flow current through laser emitter 138, and controller 130 configures optical attenuator 142 to be in the non-attenuation state. In the burst-on state, the current through laser emitter 138 is increased such that the amount of optical power outputted by laser emitter 138 is greater than or equal to the optical power threshold.

In one or more examples, controller 130 is configured to configure laser driver 136 and optical attenuator 142 in the pre-burst state a threshold amount of time (e.g., 1 to 10 micro-seconds) before transitioning to the burst-on state. The threshold amount of time may be approximately equal to the amount of time it takes laser emitter 138 to stabilize to its wavelength and therefore may be different laser emitter-to-laser emitter.

In the pre-burst state, controller 132 may configure laser driver 136 to cause laser emitter 138 output a predefined data pattern. In some examples, such as with external modulator 140, controller 132 may configure external modulator 140 to output the predefined data pattern. The predefined data pattern may be a data preamble, a pseudo-random bitstream, a series of logic zeros and ones, and the like. It may be possible to use a random noisy signal in some cases. In some examples, controller 132 may configure laser driver 136 to set the bias current of the pre-burst state based on the bias current of the burst-on state and the modulation current of the burst-on state (e.g., bias current of the pre-burst state equals bias current of the burst-on state plus half the modulation current of the burst-on state).

While the above description is the staging of laser emitter (e.g., controlling laser emitter 138 to output optical signal a few micro-seconds before burst-on) and optical attenuator 142 has been on the on-burst sequence, laser emitter 138 eventually goes from burst-on state to burst-off state. In some examples, there is no need for a post-burst state as laser emitter 138 and optical attenuator 142 can be shut off simultaneously. The reason for this is that while laser emitter 138 will be changing temperature after the current has been shut off, there is no light coming from laser emitter 138 so there is little to no possibility of spectral excursion that might occur if laser emitter 138 was emitting light. However, if laser emitter 138 emits light for a very short time after drive current (e.g., bias current or bias current plus modulation current) is eliminated, optical attenuator 142 could be staged to shut off immediately (<100 ns) before laser emitter 138.

For instance, in some examples, controller 130 may determine when ONU 108A is to transition to burst-off state from burst-on state. Controller 130 may be configured to configure optical attenuator 142 to an attenuation state less than a 100 nano-seconds before transitioning to the burst-off state.

Figure 8:
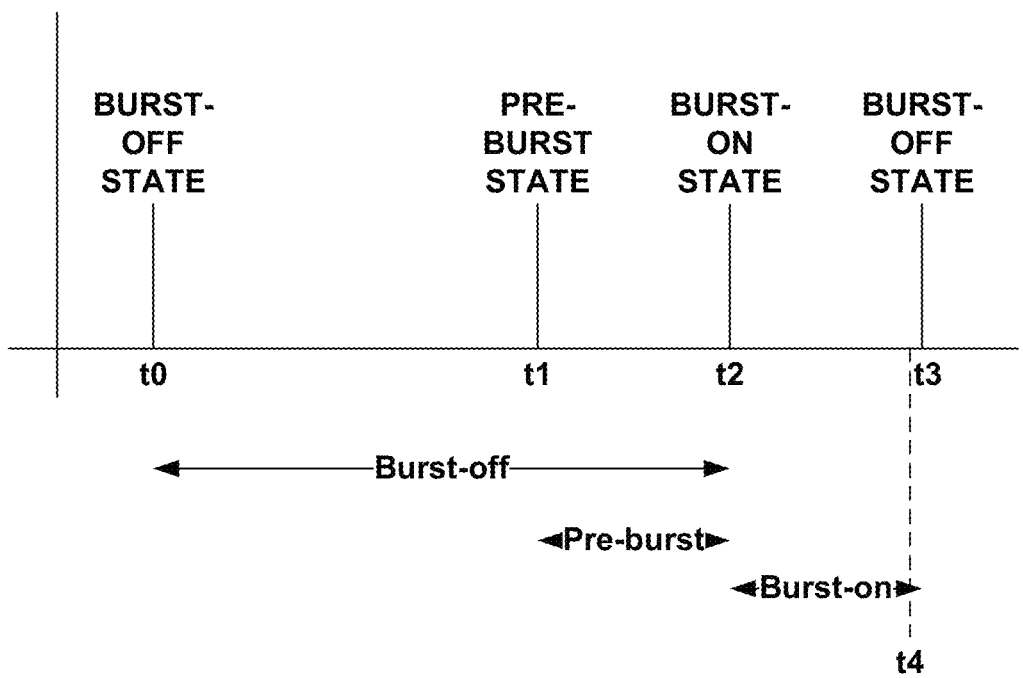
FIG. 8 is a time diagram illustrating different modes of an ONU, in accordance with the techniques described in this disclosure.

FIG. 8 is a time diagram illustrating different modes of an ONU, in accordance with the techniques described in this disclosure. For example, FIG. 8 illustrates a diagram of transmitter photonic integrated circuit (e.g., the circuitry illustrated in FIG. 7) and timing diagram for laser emitter enable/disable and optical attenuator enable/disable.

For example, initially, ONU 108A is in the burst-off state at time t0. In the burst-off state, little to no current is flowing through laser emitter 138. ONU 108A is to transition to burst-on state at time t2. However, in accordance with techniques described in this disclosure, a threshold amount of time before transitioning to the burst-on state (e.g., at time t1), ONU 108A may transition to the pre-burst state. In the pre-burst state, current flows through laser emitter 138 to cause laser emitter 138 to output optical power greater than or equal to a threshold amount of optical power (e.g., via predefined pattern or by setting the bias current appropriately); however, optical attenuator 142 is configured in the attenuation state. Therefore, between time t1 and t2, ONU 108A is in the pre-burst state.

At time t2, ONU 108A enters the burst-on state. In the burst-on state, laser emitter 138 is outputting optical power at or greater than the optical power threshold (and there is modulation of laser emitter 138 or external modulator 140). Also, optical attenuator 142 is in the non-attenuation state. At time t3, ONU 108A is to transition to the burst-off state. However, in some examples, slightly before (shown as time t4, which is less 100 ns) or immediately at the time ONU 108A transitions to the burst-off state, controller 130 may configure optical attenuator 142 to be in the attenuation state.

In terms of the G.989.2 specifications, a WNE-PSD specification may be used for transmitters capable of a pre-burst state (e.g., warm state to allow laser emitter 138 to stabilize its wavelength). The following describes some potential changes to the G.989.2 specification.

Laser emitter 138 may be turned on before optical attenuator 142 is in the non-attenuation state for a duration necessary for laser emitter 138 to stabilize its wavelength, as shown FIG. 8. The techniques can be implemented by having the optics (e.g., OLT 102A) inform ONUs 108 and 110 of the necessary lead time for a Tx enable activation (e.g., when to transition to the pre-burst state), thereby allowing the ONU to add a timing advance to the Tx enable. In some examples, controller 130 may determine the lead time for the Tx enable based on the information provided by OLT 102A. There may not be any need for ONUs 108 and 110 and optics (e.g., laser emitter 138 or external modulator 140) to have an additional turn on pin for activation of optical attenuator 142.

In some cases, time assignments and other operations performed by OLTs 102 may not require any changes. For instance, OLTs 12 may assign timeslots without change, and the pre-burst state may be controlled by respective ONUs 108. Accordingly, from the perspective of OLTs 12, there is no change in the timing. However, it may be possible for OLTs 102 to assign timeslots based on pre-burst state.

In the case of the Pre-Enabled PSD (position sensitive detector) transmitters that measure a position of a light spot, the worst-case summation at OLTs 102A-102N will be one pre-burst power and 62 off-burst powers. The "pre-enabled" refers to reducing power consumption of the laser emitter so a heater does not need to be on until just before burst-on. Therefore, the pre-burst power may be many times larger than the off-burst power without significantly impacting the total power. In the case of a 64-way PON, if the Pre-Burst transmitter type emits zero power in the off-burst state (no current to the laser emitter) the pre-burst power can be 64 times more power than the WNE-PSD is for conventional 2-state transmitters, i.e. $10*\log(64)=18$ dB more power.

Figure 9:
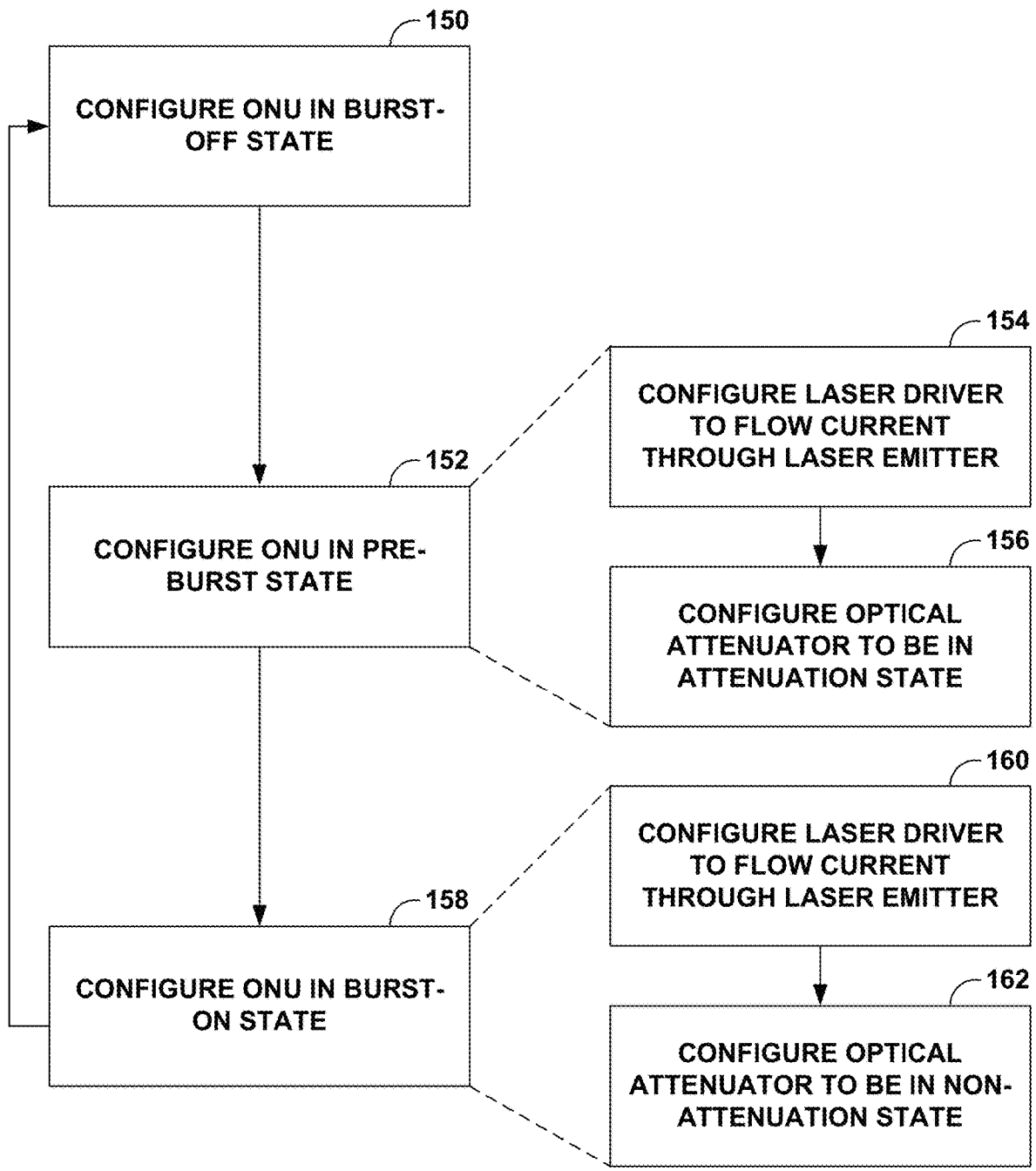
FIG. 9 is a flowchart illustrating example techniques in accordance with examples described in this disclosure.

FIG. 9 is a flowchart illustrating example techniques in accordance with examples described in this disclosure. For ease of description, the example is described with respect to ONU 108A, but the other ONUs 108 may operate in a substantially similar manner.

Controller 130 may configure ONU 108A in a burst-off state (150). In the burst-off state, controller 130 may configure laser driver 136 so that current through laser emitter 138 is reduced such that an amount of optical power outputted by laser emitter 138 is less than an optical power threshold (e.g., where the amount of optical power outputted by laser emitter 138 is 0 Watts or approximately 0 Watts). Controller 130 may configure optical attenuator 142 in an attenuation state but leaving optical attenuator 142 in a non-attenuation state is also possible during the burst-off state.

Controller 130 may configure ONU 108A in a pre-burst state (152). For example, controller 130 may configure laser driver 136 to flow current through laser emitter 138 (154). Controller 130 may also configure optical attenuator 140 to be in the attenuation state after ONU 108A has been in the burst-off state (156). In examples where optical attenuator 140 is already in the attenuation state when ONU 108A was in the burst off-state, configuring optical attenuator 140 to be in the attenuation state includes verifying or leaving optical attenuator 140 in the attenuation state. In some examples, controller 130 may configure ONU 108A in the pre-burst state for a threshold amount of time (e.g., 1 to 10 microseconds) before configuring ONU 108A in the burst-on state.

Subsequent to the pre-burst state, controller 130 may configure ONU 108A in a burst-on state (158). For example, controller 130 may configure laser driver 136 to flow current through laser emitter 138 (160). Controller 130 may also configure optical attenuator 142 to be in the non-attenuation state (162). In the burst-on state, the current through laser emitter 138 is increased (e.g., by laser driver 136) such that the amount of optical power outputted by laser emitter 138 is greater than or equal to the optical power threshold.

As illustrated in FIG. 9, after the burst-on state, controller 130 may configure ONU 108A in the burst-off state (150). In some examples, controller 130 may be configured to configure optical attenuator 140 to be in the attenuation state a threshold amount of time (e.g., less than 100 nanoseconds) before transitioning ONU 108A from the burst-on state to the burst-off state.

The example techniques described in this disclosure may be implemented in an ONU (Optical Network Unit), a device attached at the subscriber end of a PON ODN. In an ONU architecture where the laser emitter transmitter and laser driver are integrated natively onto the ONU board the scheme will be straightforward to implement, as the ONU holds both the burst schedule and the drive characteristics of the laser emitter (i.e. how long it must remain in pre-burst mode prior to bursting, to avoid BMSE). The ONU can bring the laser emitter into the pre-burst mode at an appropriate time prior to the start of the burst.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media. In this manner, computer-readable media generally may correspond to tangible computer-readable storage media which is non-transitory. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. It should be understood that computer-readable storage media and data storage media do not include carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors (e.g., processor 44 or controller 32), such as one or more digital signal processors (DSPs), general purpose microprocessors, application specific integrated circuits (ASICs), field programmable logic arrays (FPGAs), or other equivalent integrated or discrete logic circuitry. Accordingly, the term "processor" or "controller" as used herein may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples have been described. These and other examples are within the scope of the following claims.

What is claimed is:

1. An optical network unit (ONU) comprising:
a laser emitter;
a laser driver coupled to the laser emitter; and an optical attenuator having an attenuation state and a non-attenuation state, wherein:
in a pre-burst state, the laser driver flows current through the laser emitter, and the optical attenuator is in the attenuation state after the ONU has been in a burst-off state, wherein, in the burst-off state, an amount of optical power outputted by the laser emitter is less than an optical power threshold; and subsequent to the pre-burst state, in a burst-on state, the laser driver flows current through the laser emitter, wherein the optical attenuator is in the non-attenuation state, and wherein in the burst-on state, the amount of optical power outputted by the laser emitter is greater than or equal to the optical power threshold.

2. The ONU of claim 1, wherein in the pre-burst state, the laser driver flows current through the laser emitter such that the amount of optical power outputted by the laser emitter is greater than or equal to the optical power threshold.

3. The ONU of claim 1, further comprising a controller, wherein the controller is configured to:
in the pre-burst state, configure the optical attenuator to be in the attenuation state after the ONU has been in the burst-off state, and
in the burst-on state, configure the optical attenuator to be in the non-attenuation state subsequent to the pre-burst state.

4. The ONU of claim 1, wherein the optical attenuator is at least one of a semiconductor optical amplifier (SOA), a micro-electro-mechanical systems (MEMS) attenuator, or a liquid crystal shutter.

5. The ONU of claim 1, wherein the ONU is in the pre-burst state a threshold amount of time before the ONU is in the burst-on state.

6. The ONU of claim 5, wherein the threshold amount of time is within a range of 1 to 10 microseconds.

7. The ONU of claim 1, wherein the optical attenuator is in the attenuation state a threshold amount of time before the ONU transitions from the burst-on state to the burst-off state.

8. The ONU of claim 7, wherein the threshold amount of time is less than 100 nanoseconds.

9. The ONU of claim 1, wherein in the pre-burst state, the laser driver flows both bias current and modulation current through the laser emitter to output a predefined signal.

10. The ONU of claim 1, wherein in the pre-burst state, the laser driver flows bias current through the laser emitter and an external modulator outputs a predefined signal.

11. The ONU of claim 1, wherein in the pre-burst state, the laser driver flows a bias current in the pre-burst state that is based on both a bias current during the burst-on state and a modulation current during the burst on-state.

12. A method comprising:
in a pre-burst state of an optical network unit (ONU):
flowing, with a laser driver, current though a laser emitter; and
attenuating, with an optical attenuator in an attenuation state, optical power outputted by the laser emitter after the ONU has been in a burst-off state, wherein, in the burst-off state, an amount of optical power outputted by the laser emitter is less than an optical power threshold; and
subsequent to the pre-burst state and in a burst-on state of the ONU:
flowing, with the laser driver, current through the laser emitter; and
passing through, with the optical attenuator in a non-attenuation state, the optical power outputted by the laser emitter, wherein in the burst-on state, the amount of optical power outputted by the laser emitter is greater than or equal to the optical power threshold.

13. The method of claim 12, wherein in the pre-burst state, flowing current through the laser emitter comprises flowing current through the laser emitter such that the amount of optical power outputted by the laser emitter is greater than or equal to the optical power threshold.

14. The method of claim 12, wherein attenuating comprises configuring, with a controller, the optical attenuator to be in the attenuation state after the ONU has been in the burst-off state, and wherein passing through comprises configuring, with the controller, the optical attenuator to be in the non-attenuation state subsequent to the pre-burst state.

15. The method of claim 12, wherein the ONU is in the pre-burst state a threshold amount of time before the ONU in the burst-on state.

16. The method of claim 12, further comprising:
configuring the optical attenuator to be in the attenuation state a threshold amount of time before the ONU transitions from the burst-on state to the burst-off state.

17. The method of claim 12, wherein, in the pre-burst state, flowing current comprises, in the pre-burst state, flowing both bias current and modulation current through the laser emitter to output a predefined signal in the pre-burst state.

18. The method of claim 12, wherein, in the pre-burst state, flowing current comprises, in the pre-burst state, flowing bias current through the laser emitter, the method further comprising outputting, with an external modulator, a predefined signal in the pre-burst state.

19. The method of claim 12, wherein, in the pre-burst state, flowing current comprises, in the pre-burst state, flowing a bias current in the pre-burst state that is based on both a bias current during the burst-on state and a modulation current during the burst on-state.

20. An optical network unit (ONU) comprising:
means for flowing current though a laser emitter in a pre-burst state of the ONU;
means for attenuating optical power outputted by the laser emitter, in the pre-burst state of the ONU and after the ONU has been in a burst-off state, wherein, in the burst-off state, an amount of optical power outputted by the laser emitter is less than an optical power threshold;
means for flowing current through the laser emitter in a burst-on state of the ONU that is subsequent to the pre-burst state; and
means for passing through the optical power outputted by the laser emitter in the burst-on state of the ONU that is subsequent to the pre-burst state, wherein in the burst-on state, the amount of optical power outputted by the laser emitter is greater than or equal to the optical power threshold.

* * * * *